United States Patent
Deboy et al.

(10) Patent No.: US 7,126,354 B2
(45) Date of Patent: Oct. 24, 2006

(54) CIRCUIT CONFIGURATION HAVING A LOAD TRANSISTOR AND A CURRENT MEASURING CONFIGURATION, METHOD FOR ASCERTAINING THE LOAD CURRENT IN A LOAD TRANSISTOR, SEMICONDUCTOR COMPONENT, AND MEASURING CONFIGURATION

(75) Inventors: Gerald Deboy, München (DE); Ilia Zverev, München (DE)

(73) Assignee: Infineon Technologies AG, Munich (DE)

( * ) Notice: Subject to any disclaimer, the term of this patent is extended or adjusted under 35 U.S.C. 154(b) by 477 days.

(21) Appl. No.: 10/654,696

(22) Filed: Sep. 4, 2003

(65) Prior Publication Data

US 2006/0181289 A1 Aug. 17, 2006

(30) Foreign Application Priority Data

Sep. 4, 2002 (DE) ................................ 102 40 914

(51) Int. Cl.
  *G01R 27/08* (2006.01)
  *G05F 3/16* (2006.01)
(52) U.S. Cl. ...................................... 324/713; 323/316
(58) Field of Classification Search ................ 324/713, 324/691, 649, 123, 126, 522, 537, 600, 705, 324/76.11, 158.1; 702/57, 64; 323/315, 323/316
See application file for complete search history.

(56) References Cited

U.S. PATENT DOCUMENTS

| | | | |
|---|---|---|---|
| 5,099,186 A * | 3/1992 | Rippel et al. | 318/803 |
| 5,144,514 A | 9/1992 | Sekigawa | |
| 5,375,029 A | 12/1994 | Fukunaga et al. | |
| 5,568,343 A * | 10/1996 | Kosugi | 361/36 |
| 5,663,574 A | 9/1997 | Hierold et al. | |
| 5,815,027 A | 9/1998 | Tihanyi et al. | |
| 5,867,014 A | 2/1999 | Wrathall et al. | |
| 6,011,413 A | 1/2000 | Hayakawa et al. | |
| 6,538,289 B1 | 3/2003 | Topp et al. | |
| 6,737,856 B1 * | 5/2004 | Sander | 324/158.1 |
| 6,788,088 B1 * | 9/2004 | Throngnumchai | 324/763 |

(Continued)

FOREIGN PATENT DOCUMENTS

DE 40 20 187 C2 1/1991

(Continued)

OTHER PUBLICATIONS

Jens Peer Stengl et al.: :Leistungs-MOS-FET-Praxis" [power MOS FET practice], *Pflaum Verlag Müchen*, 2$^{nd}$ ed., 1992, pp. 32-32-35.

*Primary Examiner*—Vincent Q. Nguyen
*Assistant Examiner*—Hoai-An D. Nguyen
(74) *Attorney, Agent, or Firm*—Laurence A. Greenberg; Werner H. Stemer; Ralph E. Locher

(57) ABSTRACT

A circuit configuration has a load transistor and a current measuring configuration. A method ascertains a load current through a load transistor. The circuit configuration includes a first and a second current sensor with a current measuring transistor in each case. Each of the current sensors provide a current measurement signal that is fed to an evaluation circuit. The evaluation circuit provides, from the first current measurement signal, a current measurement signal that is dependent on the load current. The load transistor and the current measuring transistors are preferably integrated in a common semiconductor body having a multiplicity of transistor cells of identical construction. The evaluation circuit preferably accounts for the spatial position of the cells of the first and second current measuring transistors in the cell array.

17 Claims, 5 Drawing Sheets

U.S. PATENT DOCUMENTS

| | | | |
|---|---|---|---|
| 7,009,403 B1 * | 3/2006 | Graf et al. | 324/522 |
| 2002/0101225 A1 | 8/2002 | Oyrer | |

FOREIGN PATENT DOCUMENTS

| | | |
|---|---|---|
| DE | 43 34 386 A1 | 4/1994 |
| DE | 44 34 894 A1 | 4/1996 |
| DE | 195 20 735 A1 | 12/1996 |
| DE | 198 25 029 A1 | 12/1998 |
| DE | 198 23 768 A1 | 12/1999 |
| DE | 198 44 665 C1 | 3/2000 |
| DE | 199 58 234 A1 | 6/2001 |
| DE | 101 03 920 A1 | 8/2002 |
| EP | 0 397 102 B1 | 11/1990 |
| EP | 0 688 077 B1 | 12/1995 |

* cited by examiner

CIRCUIT CONFIGURATION HAVING A LOAD TRANSISTOR AND A CURRENT MEASURING CONFIGURATION, METHOD FOR ASCERTAINING THE LOAD CURRENT IN A LOAD TRANSISTOR, SEMICONDUCTOR COMPONENT, AND MEASURING CONFIGURATION

BACKGROUND OF THE INVENTION

Field of the Invention

The present invention relates to a circuit configuration having a load transistor and a current measuring configuration for the purpose of ascertaining a load current through the load transistor and to a method for ascertaining the load current through a load transistor.

Power transistors are frequently used as switches in order to drive electrical loads. Power transistors of this type are used, for example, in switched-mode power supplies, lamp ballasts, drive circuits for motors, interior and exterior motor vehicle lighting, etc. It is often necessary in this case to ascertain the current flowing through the transistor in order to be able to switch off the transistor and protect it from destruction in the event of the load short-circuiting, for example.

To detect the load current flowing through a transistor it is known practice, by way of example, to connect a shunt resistor in series with the load path of the transistor and to use the voltage drop across the resistor and the resistance of the shunt resistor to ascertain the load current in accordance with Ohm's law. The disadvantage of this is that the entire load current flows through the shunt resistor, with the result that the current measurement entails considerable losses. The resistance of the shunt resistor may be lowered in order to reduce these losses. However, limits are imposed on arbitrary lowering of this resistance, since interference has a disproportionate effect on the measurement result as this resistance is lowered further.

Another way of measuring the load current flowing through a power transistor is to measure the current in accordance with the "current-sense" principle. The basis of this current measuring principle is that, in addition to the load transistor, a current measuring transistor of the same type as the load transistor is provided; the current measuring transistor has a smaller transistor area than the load transistor and is operated at the same operating point as the load transistor. The current flowing through the current measuring transistor is then related to the load current by way of the ratio of the transistor area of the load transistor to that of the current measuring transistor, with the result that the load current can easily be ascertained by using the current flowing through the current measuring transistor.

Circuit configurations having a load transistor and a current measuring configuration of this type operating on the basis of the current-sense principle are described, for example, in German published, non-prosecuted patent application DE 43 34 386 A1 (which corresponds to U.S. Pat. No. 5,375,029) and German Patent No. DE 40 20 197 C2.

As is sufficiently well known, power transistors are constructed in the form of cells. In this case, a multiplicity of identical transistor cells are present which each have all the structure features of a transistor. These transistor cells are connected in parallel. In the case of a power MOSFET, for example, all the source zones of the transistor cells are jointly connected to a source terminal. All the gate electrodes of the transistor cells are connected to a gate terminal. All of the drain zones are connected to a common drain terminal. A drain zone is common to the transistor cells anyway. A lattice-shaped gate electrode is present for all cells in the case of a drain-down transistor. The basic configuration of a MOSFET of this type is described, for example, in Stengl/Tihanyi: "Leistungs-MOS-FET-Praxis" [Power MOSFET practice], Pflaum Verlag, Munich, 1992, pages 32–35. In order to realize a current measuring transistor for current measurement in accordance with the current-sense principle, it is known practice to use some of the transistor cells in a cell array of this type as current measuring transistor, as is described in published, non-prosecuted German patent application no. DE 199 58 234 A1 and explained briefly with reference to FIG. 1.

FIG. 1A shows a cross section through a prior-art power MOSFET constructed in the form of cells. The MOSFET includes a semiconductor body 100 with a front side 101, source zones 40 of a first conduction type that are surrounded by channel zones or body zones 30 of a second conduction type being introduced in the region of the front side 101. A drain zone 22 of the first conduction type is present in the region of a rear side 102 of the semiconductor body, with a semiconductor region 21 between the drain zone 22 and the body zones 30 likewise being of the first conduction type and serving as the drift zone of the semiconductor component. In the case of an n-conductive MOSFET, the source zones 40, the drain zone 22, and the drift zone 21 are n-doped while the channel zones 30 are p-doped. In an IGBT, the semiconductor zone 22 on the rear side 102 is doped so as to be complementary to the drift zone 21. A gate electrode 50 is present above the front side 101. The gate electrode 50 is disposed such that it is insulated from the semiconductor body 100 and forms a conductive channel in the body zones 30 between the source zones 40 and the drift zone 21 when a drive potential is applied.

FIG. 1B shows a cross section through the semiconductor body 100 shown in FIG. 1A along the sectional plane A—A. As is illustrated by way of example in FIG. 1B, the channel zones 30 are disposed in the form of a square and the source zones 40 are disposed in a correspondingly annular manner in the channel zones 30. The semiconductor component shown in FIG. 1B has a multiplicity of repeating structures. These structures are referred to as transistor cells Z. It goes without saying that it is possible to use any other desired geometries, such as hexagonal channel zones 30 and circular source zones 40 (as seen in plan view), in order to obtain a cell structure of this type. In the semiconductor component shown in FIG. 1B, a gate electrode 50 (see FIG. 1A) is common to all cells. Furthermore, the drain zone 22 and the drain electrode D are respectively common to all transistor cells. For the purpose of realizing a load transistor, the plurality of source zones 40 of the transistor cells are connected to a common source electrode 51 having a source terminal S1, while the source zones 40 of a smaller number of cells are connected to a second source electrode 52 having a source terminal S2.

FIG. 1C shows the electrical equivalent circuit diagram of a semiconductor component of this type having a load transistor TL and a current measuring transistor TM. The gate terminals of the load transistor TL and of the current measuring transistor TM are connected to a common gate terminal G and the drain terminals being connected to a common drain terminal D. The two transistors, however, have separate source terminals S1 and S2, respectively, it being possible to connect a load to the source terminal S1 of the load transistor TL and to tap off a measurement current at the source terminal S2 of the current measuring transistor TM.

Precise current measurement using a current measuring transistor integrated in the same semiconductor body as the load transistor presupposes that the transistor cells in the load transistor and the transistor cells in the current measuring transistor are of identical construction. It must be ensured in this case that the cell array of a power transistor fundamentally has two different types of transistor cell: transistor cells at the edge of the cell array ("edge cells") and transistor cells inside the cell array. When driven in an identical manner, that is to say with identical drain-source voltages and identical gate potentials, edge cells and cells inside the cell array differ in terms of the drain-source current flowing per cell. This current is thus smaller in cells inside the cell array that are surrounded on all sides by further transistor cells, owing, for example, to current pinching effects as a result of closely adjacent channel regions, JFET effects as a result of body zones of adjacent transistor cells etc., than in cells located at the edge that are not adjoined by any further transistor cell in at least one direction. A significantly larger semiconductor region is available to the drift path there for current flow, resulting in a "watering can effect" from which there results a higher current flow. FIG. 1A shows, on the far right, an edge cell of this type. The edge cell has a larger drift zone region available to the right than two cells which are adjacent one another inside the cell array and share a narrower drift zone region between two body zones 30, the adjacent body zones 30 additionally being able to bring about a current pinching effect.

Because the number of transistor cells used for the current measuring transistor is usually substantially lower than the number of transistor cells in the load transistor, and because the current measuring transistors are frequently located at the edge for connection reasons and owing to the realizability of the separate source electrode, edge cell effects of this type in the current measuring transistors have a disproportionate effect relative to the load transistor, with the result that the current flowing through the current measuring transistor is in fact not in proportion to the current through the load transistor even when the load transistor and the current measuring transistor are operated at the same operating point.

SUMMARY OF THE INVENTION

It is accordingly an object of the invention to provide a circuit configuration having a load transistor and a current measuring configuration, method for ascertaining the load current in a load transistor, a semiconductor component, and a measuring configuration that overcome the hereinafore-mentioned disadvantages of the heretofore-known devices of this general type and that has a load transistor and a current measuring configuration for the purpose of ascertaining the load current through the load transistor and to provide a method for ascertaining a load current through a load transistor, a precise current measurement value being ascertained for the current through the load transistor.

With the foregoing and other objects in view, there is provided, in accordance with the invention, a circuit configuration. The circuit configuration includes a load transistor and a current measuring configuration. The load transistor has a first and a second load path terminal and a control terminal. The current measuring configuration ascertains a load current through the load transistor and includes a first current sensor, a second current sensor, and an evaluation circuit. The first current sensor includes a first current measuring transistor having a first and a second load path terminal and a control terminal. The first load path terminal is connected to the load path terminal of the load transistor. The control terminal is connected to the control terminal of the load transistor. The first current sensor provides a first current measurement signal. The second current sensor includes a second current measuring transistor having a first and a second load path terminal and a control terminal. The first load path terminal is connected to the first load path terminal of the load transistor. The control terminal is connected to the control terminal of the load transistor. The second current sensor provides a second current measurement signal. The evaluation circuit connects to the first and the second current sensor, receives the first and the second current measurement signals, and provides a current measurement signal that depends on the load current.

With the objects of the invention in view, there is also provided a method for ascertaining a signal that depends on a load current through a load transistor that has a first and a second load path terminal. The first step of the method includes providing a first current measurement signal by using a first current sensor including a first current measuring transistor having a first and a second load path terminal and a control terminal. The first load path terminal is connected to the load path terminal of the load transistor and the control terminal is connected to the control terminal of the load transistor. The next step is providing a second current measurement signal by using a second current sensor including a second current measuring transistor having a first and a second load path terminal and a control terminal. The first load path terminal is connected to the load path terminal of the load transistor and the control terminal is connected to the control terminal of the load transistor. The next step is calculating a current measurement signal that depends on the load current by using the first and second current measurement signals.

The circuit configuration according to the invention includes a load transistor (having a first and a second load path terminal and a control terminal) and a current measuring configuration for the purpose of ascertaining a load current through the load transistor. The current measuring configuration includes a first current sensor with a first current measuring transistor that has a first and a second load path terminal and a control terminal. The first load path terminal is connected to the first load path terminal of the load transistor and the control terminal is connected to the control terminal of the load transistor. The first current sensor provides a first current measurement signal. The current measuring configuration furthermore includes a second current sensor with a second current measuring transistor that has a first and a second load path terminal and a control terminal. The first load path terminal is connected to the first load path terminal of the load transistor and the control terminal is connected to the control terminal of the load transistor. The second current sensor provides a second current measurement signal. The first and second current measurement signals are fed to an evaluation circuit in order to provide a current measurement signal that is dependent on a load current in the load transistor.

The load transistor and the current measuring transistors are preferably integrated in a semiconductor body having a multiplicity of transistor cells of identical construction, the load transistor being formed by a number of transistor cells that are connected in parallel and the current measuring transistors each being formed by at least one transistor cell.

One of the two current measuring transistors advantageously has a larger number of parallel-connected transistor cells than the other current measuring transistor, the difference in the number of transistor cells in the first and second current measuring transistors preferably being a factor of 2 or more.

For the purpose of providing the first and second current measurement signals, the current sensors each include, for example, a control circuit that, during operation, sets a potential on the second load path terminal of the respective current measuring transistor to a value that corresponds to the potential on the second load path terminal of the load transistor in order to ensure that the load transistor and the two current measuring transistors are operated at the same operating point. To detect a current flowing through the current measuring transistors, a respective current measuring configuration, for example, is connected in series with the current measuring transistors. The configuration provides the first or, respectively, second current measurement signal. In the simplest case, the current measuring configuration includes a current measuring resistor, a voltage drop across this current measuring resistor forming the first or, respectively, second current measurement signal.

In addition to the first and second current measurement signals, the evaluation circuit also preferably accounts for information relating to the position of the transistor cells of the current measuring transistors in the cell array when ascertaining the current measurement signal. This allows, for example, the edge cell effects that were explained initially to be taken into account when ascertaining the current measurement signal for the load current in the load transistor from the first and second current measurement signals from the current measuring transistors.

In the case of the method according to the invention for ascertaining a signal which is dependent on a load current through a load transistor which has a first and a second load path terminal, provision is made for a first and a second current measurement signal to be provided and for the current measurement signal that is dependent on the load current to be ascertained using the first and second current measurement signals. The first and second current measurement signals are ascertained in each case by using a current sensor. Each of the current sensors has a current measuring transistor with a first and a second load path terminal and a control terminal. The control terminals of the current measuring transistors are connected to the control terminal of the load transistor and the first load path terminals of the current measuring transistors are connected to the control terminal of the load transistor.

For the purpose of providing the current measurement signal, provision is made, for example, for the current measuring transistors to be operated at the same operating point as the load transistor and for a measurement current then flowing through the current measuring transistors to be ascertained.

Other features that are considered as characteristic for the invention are set forth in the appended claims.

Although the invention is illustrated and described herein as embodied in a circuit configuration having a load transistor and a current measuring configuration, a method for ascertaining the load current in a load transistor, a semiconductor component, and a measuring configuration it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Unless otherwise specified, identical reference symbols in the figures designate identical parts, components and structure regions with the same meaning.

Figure 1A:
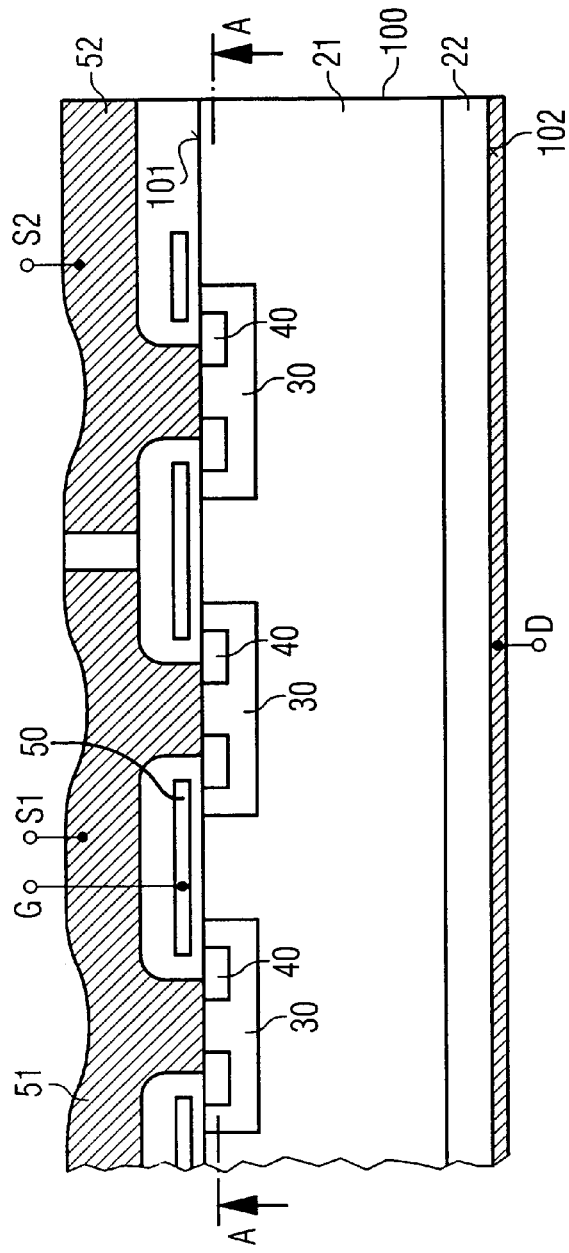
FIG. 1A is a fragmentary diagrammatic sectional side view showing a semiconductor component according to the prior art having a load transistor constructed in the form of cells and a current measuring transistor constructed in the form of cells.
Figure 1B:
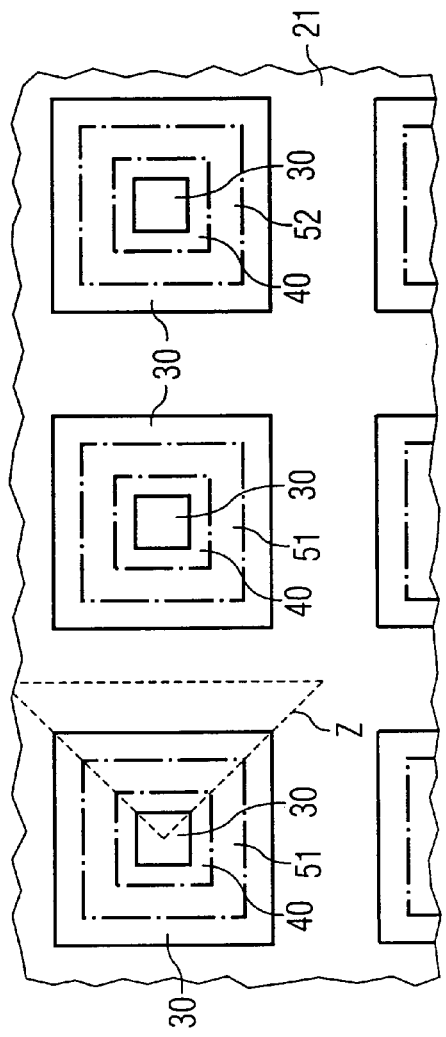
FIG. 1B is a fragmentary plan view (FIG. 1A) through a sectional plane A—A shown in FIG. 1A of the semiconductor component.
Figure 1C:
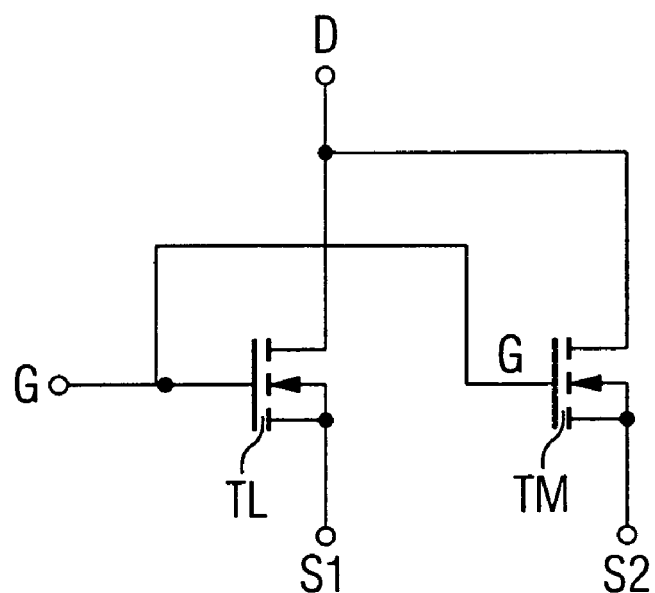
FIG. 1C is an electrical circuit diagram of the semiconductor component shown in FIGS. 1A and 1B.
Figure 2:
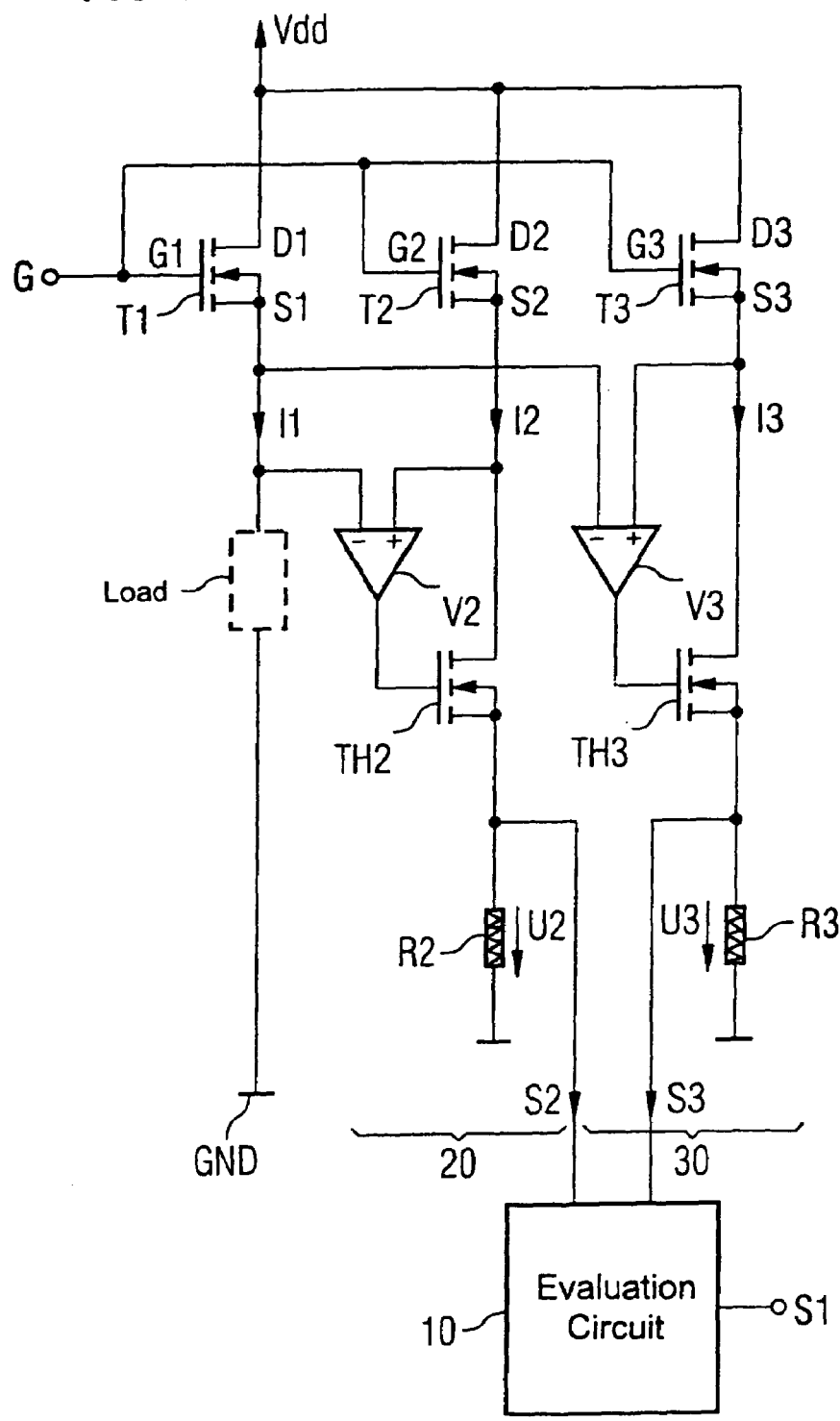
FIG. 2 is a circuit diagram of a circuit configuration according to the invention having a load transistor and a first and a second current sensor and also an evaluation circuit.

Referring now to the figures of the drawings in detail and first, particularly to FIG. 2 thereof, there is shown an exemplary embodiment of a circuit configuration according to the invention having a load transistor T1 and a first and a second current sensor 20, 30, each of which has a current measuring transistor T2, T3, and having an evaluation circuit 10. The load transistor T1 and the current measuring transistors T2, T3 are of the same type and are illustrated as n-conductive MOSFETs by way of example in FIG. 2. The load transistor T1 and the current measuring transistors T2, T3 may be in the form of any other desired transistor components, in particular as IGBTs.

In the exemplary embodiment, a first load path terminal of the load transistor T1 is formed by the drain terminal D1 thereof and a second load path terminal of the transistor T1 is formed by the source terminal S1 thereof. The gate terminal G1 forms the control terminal of the load transistor T1. For the purpose of illustrating the mode of operation, the load transistor T1 in the exemplary embodiment is connected in series with a load, this series circuit being at a voltage between the supply potential Vdd and reference-ground potential GND. The current measuring transistors T2, T3 likewise each have a first load path terminal that is formed by the drain terminals D2, D3 of the transistors. Control terminals of these current measuring transistors T2, T3 are formed by the gate terminals G2, G3 thereof and second load path terminals are formed by the source terminals S2, S3 thereof. The drain terminals D2, D3 of the current measuring transistors T2, T3 in the current sensors 20, 30 are connected to the drain terminal D1 of the load transistor T1 and the gate terminals G2, G3 of the current measuring transistors T2, T3 are connected to the gate terminal G1 of the load transistor T1.

In order to measure the current, the first and second current measuring transistors T2, T3 of the current sensors 20, 30 are operated at the same operating point as the load transistor T1. For this purpose, the current sensors 20, 30 each include a control circuit having an operational amplifier V2, V3 and an auxiliary transistor TH2, TH3. In the exemplary embodiment, the auxiliary transistors TH2, TH3 are likewise in the form of n-conductive MOSFETs, the drain-source paths of which are connected in series with the drain-source path of the associated current measuring transistor T2 or T3, respectively. The operational amplifiers V2, V3 are each connected between the source terminal S1 of the load transistor T1 and the source terminal S2 or S3, respectively, of the associated current measuring transistor T2 or T3, respectively, each operational amplifier V2, V3 driving one of the auxiliary transistors TH2 and TH3, respectively. The operational amplifiers V2, V3 compare the potential on the source terminal S1 of the load transistor T1 with that on the source terminal S2 or S3, respectively, of the respective current measuring transistor T2, T3 and in each case set the auxiliary transistor TH2, TH3 in such a manner that these potentials on the source terminals S1, S2, S3 match.

A load current I1 flows through the load transistor T1 when a load is connected, while a first measurement current I2 flows through the first current measuring transistor T2 and a second measurement current I3 flows through the second current measuring transistor T3. For the purpose of detecting these measurement currents I2, I3, current measuring resistors R2 and R3, respectively, are in each case connected in series with the auxiliary transistors TH2, TH3. These current measuring resistors R2, R3 preferably have the same resistance. A voltage U2 across the resistor R2 of the first current sensor 20 is fed to the evaluation circuit 10 as first current measurement signal S2. A voltage U3 across the resistor R3 of the second current sensor 30 is correspondingly fed to the evaluation circuit 10 as second current measurement signal S3.

The current measuring configuration 10 evaluates the first and second current measurement signals S2, S3 in order to provide a current measurement signal S1 that is dependent on the load current I1. The evaluation unit 10 in this case accounts for the ratio of the transistor area of the first current measuring transistor T2 with respect to the load transistor T1 to that of the second current measuring transistor T3 with respect to the load transistor T1, given that the measurement currents I2, I3 are each approximately related to the load current by way of this ratio if the load transistor T1 and the measuring transistors T2, T3 are operated at the same operating point.

Figure 3:
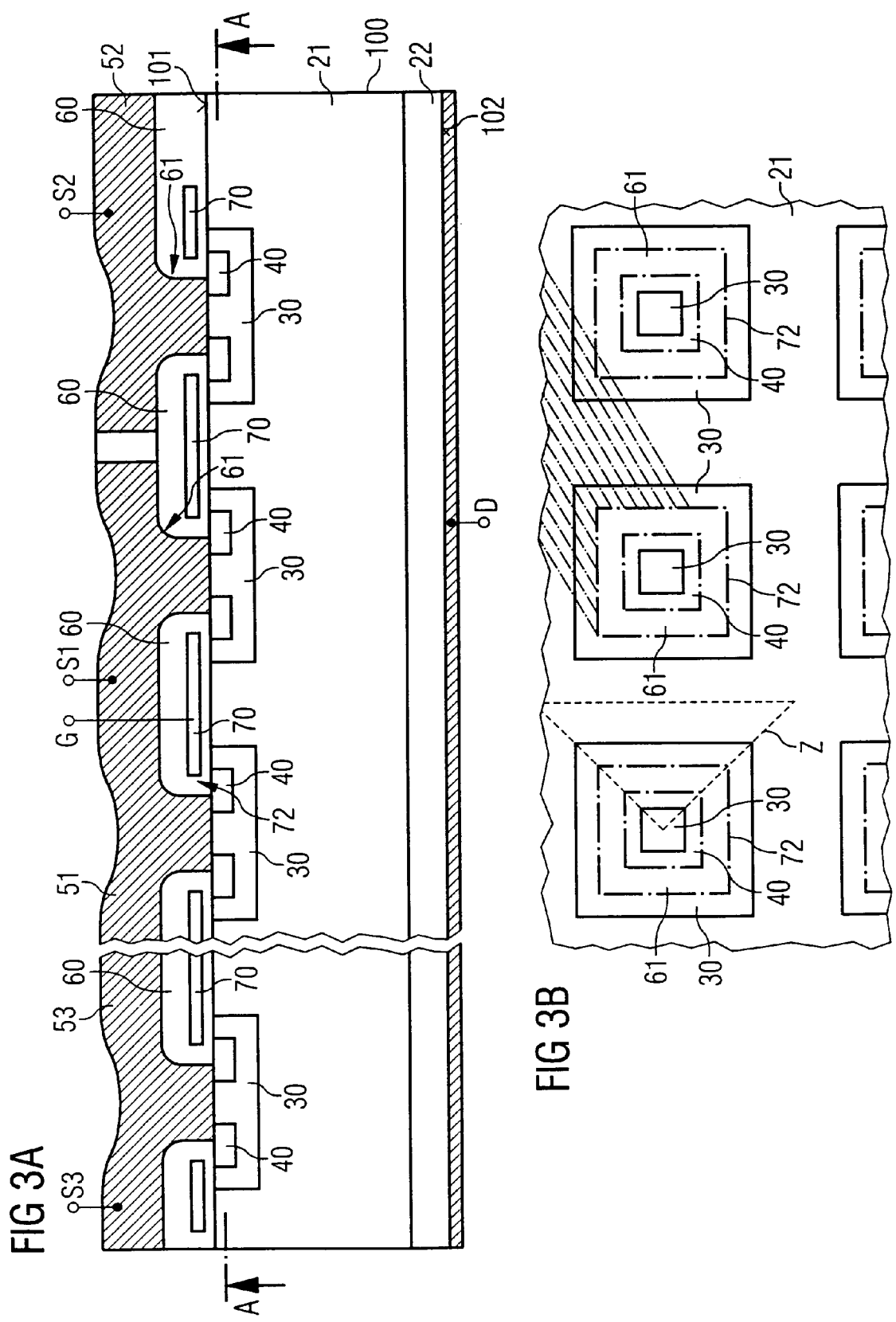
FIG. 3A is a fragmentary, diagrammatic side sectional view of a semiconductor component having a multiplicity of transistor cells of identical construction that form a load transistor and two current measuring transistors.
FIG. 3B is a plan view of the semiconductor component shown in FIG. 3A taken along line A—A.

The load transistor T1 and the first and second current measuring transistors T2, T3 are preferably integrated in a semiconductor body or chip, as is illustrated by way of example in FIGS. 3A–3B. FIG. 3A shows a cross-sectional side view of a semiconductor component having a multiplicity of transistor cells of identical construction. An n-conductive MOSFET is formed by each transistor cell. The semiconductor component includes a semiconductor body 100 with a drift zone 21 of a first conduction type, a multiplicity of channel zones or body zones 30 of a second conduction type being formed in this drift zone 21 in the region of a front side 101 of the semiconductor body 100. Source zones 40 of the first conduction type are respectively formed in these channel zones or body zones 30. In the region of the rear side of the semiconductor body 100, the drift zone 21 is adjoined by a drain zone 22 of the first conduction type, with which a drain electrode D makes contact. A gate electrode 70, which is connected to a gate terminal G and is disposed in an insulation layer 60 above the front side 101 such that it is insulated from the semiconductor body 100, is used to form a conductive channel between the source zones 40 and the drift zone 21, some sections of the latter extending as far as the front side 101.

FIG. 3B shows a cross section through the component in the sectional plane A—A depicted in FIG. 3A. In this exemplary embodiment, the body zones 30 are approximately square and the source zones 40 are likewise square in plan view and have a square cutout in the center. In the exemplary embodiment, the insulation layer 60 has square contact holes 61 which are illustrated by dashed lines in FIG. 3B and in which source electrodes 51 and 52 and 53, respectively, make contact with source zones 40 and body zones 30. The gate electrode G is common to all transistor cells and is of lattice-shaped construction, cutouts 72 in the gate electrode 70 in the region of the contact holes 61 in the insulation layer 60 being depicted by dash-dotted lines in FIG. 3B.

The cell structure shown in plan view in FIG. 3B includes a multiplicity of repeating structure regions, a repeating structure region of this type being depicted by dotted lines in FIG. 3B and being designated Z. This structure region forms a transistor cell in the semiconductor body 100. For the purpose of subdividing the cell array into a load transistor and two current measuring transistors, three source electrodes S1, S2, S3 are provided which are insulated from one another and each make contact with a number of transistor cells. The gate electrode 70 and the drift or drain zone 21, 22, respectively, are common to all cells.

Figure 4:
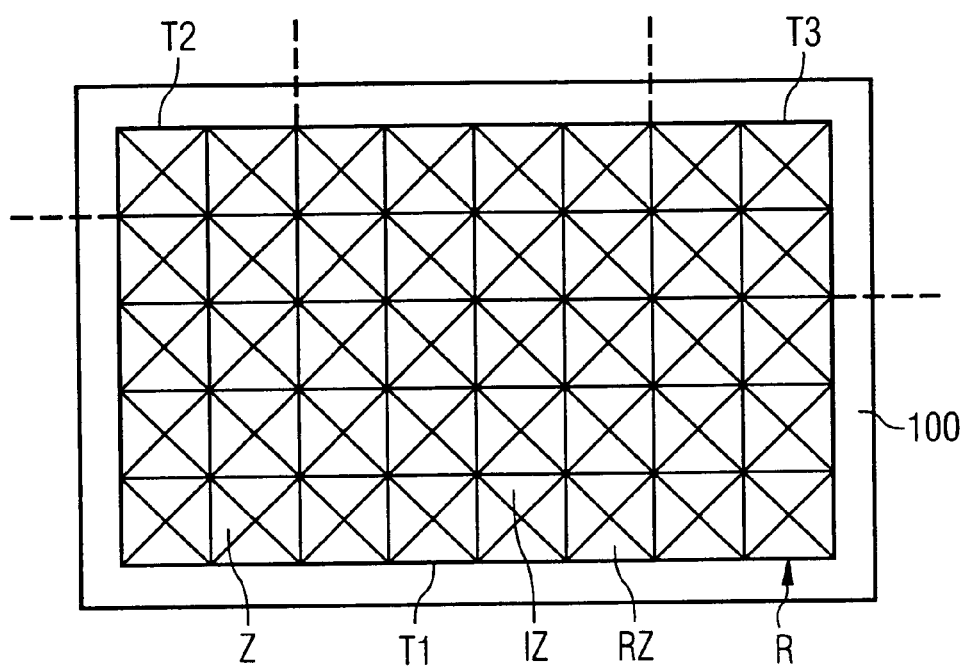
FIG. 4 is a diagrammatic plan view showing an exemplary diagrammatic illustration of a number of transistor cells and their subdivision into three groups in order to form a load transistor and two current measuring transistors.

FIG. 4 diagrammatically shows a plan view of the cell array in the semiconductor body 100. Each cell Z is illustrated diagrammatically as a triangle. FIG. 4 shows, by way of example, the subdivision of this cell array into the load transistor T1 and the first current measuring transistor T2 and the second current measuring transistor T3, the current measuring transistors T2, T3 each being formed by cells in the edge region of the cell array and differing from one another in the number of transistor cells used. The reference symbol RZ in FIG. 4 denotes, by way of example, an edge cell, that is to say a cell that is not entirely surrounded by further transistor cells. In contrast, the reference symbol IZ denotes a cell inside the cell array which is entirely surrounded by further transistor cells.

Assuming that each of the transistor cells supplies the same proportion of overall current (provided all the transistor cells are operated at the same operating point) and N1 is the number of transistor cells in the load transistor T1, N2 is the number of transistor cells in the first current measuring transistor T2 and N3 is the number of transistor cells in the second current measuring transistor T3, the following would hold true for the load current I1:

$$I1 = = N1/N2 \cdot I2 \sim N1/N3 \cdot I3 \qquad (1).$$

However, the edge cells RZ supply a current that differs from that of the cells IZ inside the cell array, is encumbered with an error g with respect to the cells inside the cell array and, according to experience, may amount to 30%, as a result of which the following holds true for the first measurement current I2:

$$I2 = (g \cdot r2/N1 + i2/N1) \cdot I1 \qquad (2)$$

where r2 is the number of edge cells RZ in the first current measuring transistor T2 and i2 is the number of cells IZ inside the cell array of the second current measuring transistor T3. The following accordingly holds true for the measurement current I3:

$$I3 = (g \cdot r3/N1 + i3/N1) \cdot I1 \quad (3)$$

where r3 is the number of edge cells RZ in the second current measuring transistor T3 and i3 is the number of cells IZ inside the cell array of the current measuring transistor T3.

The above two equations with the load current I1 and the error g (unknown variable) caused by the edge cells RZ can be used to ascertain the load current I1 as follows on the basis of simple mathematical conversion:

$$I1 = 1/N1 \cdot (r3 \cdot I2 - r2 \cdot I3)/(i2 \cdot r3 - i3 \cdot r2) \quad (4)$$

The evaluation circuit 10 is thus preferably configured to ascertain the first current measurement signal S1 from the first and second current measurement signals S2, S3 using the following relationship:

$$S1 = 1/N1 \cdot (r3 \cdot S2 - r2 \cdot S3)/(i2 \cdot r3 - i3 \cdot r2) \quad (5)$$

The load current I1 is obtained from this current measurement signal S1 by dividing the latter by the resistance of the current measuring resistors R2, R3, which are preferably identical.

The use of two current measuring sensors 20, 30 having a respective current measuring transistor T2, T3 and the knowledge of the number of transistor cells that are located at the edge of the cell array and of the number of transistor cells that are located inside the cell array in the current measuring transistors T2, T3 allow a current measurement signal S1 for the load current to be ascertained in the manner explained above using the inventive circuit configuration, edge cell effects having been eliminated from the current measurement signal S1.

The current measuring principle according to the invention may be used for any desired transistors that are preferably constructed in the form of cells, in particular for low-voltage transistors or high-voltage transistors, transistors having a planar gate electrode or a gate electrode disposed in a trench, transistors having a conventional drift path or drift paths with compensation zones, or else for IGBTs.

In the above equations for ascertaining the load current I1 from the measurement currents I2, I3, it was assumed that edge cell effects influence the measurement currents I2, I3, given that the number of transistor cells in the current measuring transistors T2, T3 is generally considerably smaller than the number of transistor cells in the load transistor and the current measuring transistors are usually disposed at the edge of the cell array, with the result that edge cells in the current measuring transistors are disproportionately represented in comparison with the load transistor. It goes without saying that the number of cells inside the cell array and the number of edge cells in the load transistor can additionally be taken into account when ascertaining the load current from the two measurement currents in the evaluation circuit 10 in order to obtain an even more precise measurement result.

We claim:

1. A circuit configuration, comprising:
   a load transistor having a first and a second load path terminal and a control terminal; and
   a current measuring configuration for ascertaining a load current through said load transistor and including:
   a first current sensor with a first current measuring transistor having a first and a second load path terminal and a control terminal, said first load path terminal being connected to said load path terminal of said load transistor and said control terminal being connected to said control terminal of said load transistor, and said first current sensor providing a first current measurement signal;
   a second current sensor with a second current measuring transistor having a first and a second load path terminal and a control terminal, said first load path terminal being connected to said first load path terminal of said load transistor and said control terminal being connected to said control terminal of said load transistor, and said second current sensor providing a second current measurement signal; and
   an evaluation circuit connected to said first and said second current sensors, receiving the first and the second current measurement signals, and providing a current measurement signal depending on the load current.

2. The circuit configuration according to claim 1, further comprising:
   a semiconductor body integrating said load transistor and said current measuring transistors and having a multiplicity of transistor cells of identical construction;
   a number of transistor cells connected in parallel and forming said load transistor; and
   at least one transistor cell forming each of said current measuring transistors.

3. The circuit configuration according to claim 2, wherein one of said two current measuring transistors has a larger number of parallel-connected transistor cells than the other of said current measuring transistors.

4. The circuit configuration according to claim 2, wherein one of said two current measuring transistors has at least twice as many parallel-connected transistor cells as the other of said two current measuring transistors.

5. The circuit configuration according to claim 1, wherein said first current sensor has a first control circuit configured to set a potential on said second load path terminal of said first current measuring transistor to a value corresponding to a potential on said second load path terminal of said load transistor.

6. The circuit configuration according to claim 5, further comprising a current measuring configuration providing the first current measurement signal connected in series with said first current measuring transistor.

7. The circuit configuration according to claim 1, wherein said second current sensor has a second control circuit configured to set a potential on said second load path terminal of said second current measuring transistor to a value corresponding to the potential on said second load path terminal of said load transistor.

8. The circuit configuration according to claim 7, further comprising a current measuring configuration configured to provide the second current measurement signal and connected in series with said second current measuring transistor.

9. The circuit configuration according to claim 1, wherein said evaluation circuit accounts for a spatial position of said cells of said first and second current measuring transistors in said semiconductor body.

10. The circuit configuration according to claim 9, wherein said evaluation circuit ascertains the first current measurement signal based on a relationship:

$$S1 = N1 \cdot (r3 \cdot S2 - r2 S3)/(i2 \cdot r3 - i3 \cdot r2),$$

where
- N1 is a total number of said cells in said load transistor,
- S2 is the first current measurement signal,
- S3 is the second current measurement signal,
- r2 is a number of said cells along an edge of said first current measuring transistor,
- i2 is a number of said cells in said first current measuring transistor located inside said cell array,
- r3 is a number of said cells along an edge of said second current measuring transistor, and
- i3 is a number of cells in said second current measuring transistor located inside said cell array.

11. A method for ascertaining a signal dependent on a load current through a load transistor having a first and a second load path terminal and a control terminal, the method which comprises the steps:
   providing a first current measurement signal by using a first current sensor including a first current measuring transistor having a first and a second load path terminal and a control terminal, the first load path terminal being connected to the load path terminal of the load transistor and the control terminal being connected to the control terminal of the load transistor;
   providing a second current measurement signal by using a second current sensor including a second current measuring transistor having a first and a second load path terminal and a control terminal, the first load path terminal being connected to the load path terminal of the load transistor and the control terminal being connected to the control terminal of the load transistor; and
   calculating a current measurement signal dependent on the load current by using the first and second current measurement signals.

12. The method according to claim 11, which further comprises:
   integrating the load transistor and the current measuring transistors in a semiconductor body having a multiplicity of transistor cells of identical construction;
   forming the load transistor from a number of transistor cells connected in parallel; and
   forming the current measuring transistors from at least one transistor cell.

13. The method according to claim 12, which further comprises using a larger number of parallel-connected transistor cells in one of the two current measuring transistors than the other of the current measuring transistors.

14. The method according to claim 12, which further comprises using at least twice as many parallel-connected transistor cells in one of the two current measuring transistors as the other of the two current measuring transistors.

15. The method according to claim 11, which further comprises accounting for a spatial position of the cells in the first and second current measuring transistors in the semiconductor body when ascertaining the current measurement signal.

16. The method according to claim 15, which further comprises ascertaining the current measurement signal based on a relationship:

$$S1 = N1 \cdot (r3 \cdot S2 - r2 S3)/(i2 \cdot r3 - i3 \cdot r2),$$

where
- N1 is a total number of cells in the load transistor,
- S2 is the first current measurement signal,
- S3 is the second current measurement signal,
- r2 is a number of the cells along an edge of the first current measuring transistor,
- i2 is a number of the cells in the first current measuring transistor located inside the cell array,
- r3 is a number of the cells along an edge of the second current measuring transistor, and
- i3 is a number of the cells in the second current measuring transistor located inside the cell array.

17. In a circuit configuration including a load transistor having a first and a second load path terminal and a control terminal; a current measuring configuration for ascertaining a load current through the load transistor, comprising:
   a first current sensor with a first current measuring transistor having a first and a second load path terminal and a control terminal, said first load path terminal being connected to said load path terminal of said load transistor and said control terminal being connected to said control terminal of said load transistor, and said first current sensor providing a first current measurement signal;
   a second current sensor with a second current measuring transistor having a first and a second load path terminal and a control terminal, said first load path terminal being connected to said first load path terminal of said load transistor and said control terminal being connected to said control terminal of said load transistor, and said second current sensor providing a second current measurement signal; and
   an evaluation circuit connected to said first and said second current sensor, receiving the first and the second current measurement signals, and providing a current measurement signal depending on the load current.

* * * * *